(12) United States Patent
Nagaoka (10) Patent No.: US 10,418,494 B2
(45) Date of Patent: Sep. 17, 2019

(54) METHOD OF MANUFACTURING SEMICONDUCTOR DEVICE

(71) Applicant: TOYOTA JIDOSHA KABUSHIKI KAISHA, Toyota-shi, Aichi (JP)

(72) Inventor: Tatsuji Nagaoka, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/867,242

(22) Filed: Jan. 10, 2018

(65) Prior Publication Data
US 2018/0240914 A1  Aug. 23, 2018

(30) Foreign Application Priority Data
Feb. 23, 2017 (JP) .................. 2017-032307

(51) Int. Cl.
*H01L 29/872* (2006.01)
*H01L 21/02* (2006.01)
(Continued)

(52) U.S. Cl.
CPC ...... *H01L 29/872* (2013.01); *H01L 21/02178* (2013.01); *H01L 21/02271* (2013.01);
(Continued)

(58) Field of Classification Search
CPC ............. H01L 29/872; H01L 29/66212; H01L 29/402
See application file for complete search history.

(56) References Cited

U.S. PATENT DOCUMENTS 4,674,177 A * 6/1987 Calviello ............. H01L 29/872
                                            257/E29.338
5,081,510 A * 1/1992 Ohtsuka ................ H01L 29/475
                                            257/473
(Continued)

FOREIGN PATENT DOCUMENTS

JP      2013-102081 A     5/2013
JP      2015-076577 A     4/2015
(Continued)

OTHER PUBLICATIONS

Yan et. al., Electronic structure and optical properties of Sn2xGa2(1-x)O3 compounds, Science China, Physics, Mechanics, and Astronomy, Mar. 2011, vol. 54, No. 3: 459-464. (Year: 2011).*

(Continued)

*Primary Examiner* — Steven H Loke
*Assistant Examiner* — Charles N Ausar-El
(74) *Attorney, Agent, or Firm* — Oliff PLC (57) ABSTRACT

In a method of manufacturing a semiconductor device, a Schottky electrode is formed on an upper surface of a semiconductor substrate. A second region of the semiconductor substrate is etched such that a first region becomes higher than a second region, a rising surface is formed between the first and second regions, and an outer peripheral edge of the Schottky electrode is located on the first region. An insulating film is formed on the upper surface of the semiconductor substrate such that the insulating film annularly extends along the rising surface. A field plate electrode is formed. The field plate electrode is electrically connected with the Schottky electrode and faces the upper surface of the semiconductor substrate via the insulating film within an area extending from the outer peripheral edge of the Schottky electrode to the second region over the rising surface.

12 Claims, 10 Drawing Sheets

(51) Int. Cl.
   *H01L 21/426* (2006.01)
   *H01L 21/465* (2006.01)
   *H01L 29/24* (2006.01)
   *H01L 29/40* (2006.01)
   *H01L 29/66* (2006.01)
   *H01L 29/06* (2006.01)
   *H01L 29/20* (2006.01)

(52) U.S. Cl.
   CPC .......... *H01L 21/426* (2013.01); *H01L 21/465* (2013.01); *H01L 29/0615* (2013.01); *H01L 29/2003* (2013.01); *H01L 29/24* (2013.01); *H01L 29/401* (2013.01); *H01L 29/402* (2013.01); *H01L 29/66212* (2013.01); *H01L 29/66969* (2013.01); *H01L 21/0262* (2013.01); *H01L 21/02414* (2013.01); *H01L 21/02565* (2013.01); *H01L 21/02581* (2013.01)

(56) References Cited

U.S. PATENT DOCUMENTS

| | | | | |
|---|---|---|---|---|
| 5,610,434 | A * | 3/1997 | Brogle | H01L 29/66136 257/619 |
| 7,973,381 | B2 * | 7/2011 | Chiola | H01L 29/0661 257/483 |
| 9,324,806 | B2 * | 4/2016 | Tadokoro | H01L 29/1608 |
| 9,412,882 | B2 * | 8/2016 | Takizawa | H01L 29/872 |
| 2007/0181909 | A1 * | 8/2007 | Rozsypal | H01L 29/872 257/109 |
| 2014/0332823 | A1 * | 11/2014 | Takizawa | H01L 29/872 257/76 |
| 2015/0255362 | A1 * | 9/2015 | Konrath | H01L 21/02126 257/272 |
| 2015/0295096 | A1 * | 10/2015 | Oka | H01L 29/872 257/76 |
| 2016/0254392 | A1 | 9/2016 | Hasegawa et al. | |
| 2017/0098719 | A1 * | 4/2017 | Chen | H01L 29/872 |
| 2018/0138272 | A1 * | 5/2018 | Ebihara | H01L 29/78 |
| 2019/0043999 | A1 * | 2/2019 | Nagaoka | H01L 29/0661 |

FOREIGN PATENT DOCUMENTS

| | | |
|---|---|---|
| JP | 2016-162785 A | 9/2016 |
| JP | 2017-139289 A | 8/2017 |
| JP | 2017-139293 A | 8/2017 |
| JP | 2018-137394 A | 8/2018 |
| WO | 2016/075927 A1 | 5/2016 |
| WO | 2017/134508 A1 | 8/2017 |
| WO | 2017/134509 A1 | 8/2017 |

OTHER PUBLICATIONS

Kawaharamura et. al., "Growth and electrical properties of AlOx grown by mist chemical vapor deposition", AIP Advances 3, 032135 (2013). (Year: 2013).*

* cited by examiner

FIG. 23

METHOD OF MANUFACTURING SEMICONDUCTOR DEVICE

TECHNICAL FIELD

The teachings disclosed herein relate to a method of manufacturing a semiconductor device.

BACKGROUND

Japanese Patent Application Publication No. 2013-102081 describes a semiconductor device. This semiconductor device includes a semiconductor substrate, and a Schottky electrode provided on an upper surface of the semiconductor substrate. The upper surface of the semiconductor substrate is provided with a so-called mesa structure. That is, the upper surface of the semiconductor substrate includes a first region and a second region surrounding the first region, and the first region is located higher than the second region, with a rising surface provided between the first region and the second region. The Schottky electrode is provided on the first region, and a high resistivity layer facing an outer peripheral edge of the Schottky electrode is provided on an outer peripheral portion of the first region. According to such a structure, electric field concentration in a vicinity of the outer peripheral edge of the Schottky electrode is alleviated, which improves breakdown voltage of the semiconductor device.

Japanese Patent Application Publication No. 2013-102081 further describes another semiconductor device that does not have such a mesa structure. In this semiconductor device, an outer peripheral portion of the Schottky electrode faces the semiconductor substrate via an insulating film. According to such a configuration, the outer peripheral portion of the Schottky electrode functions as a field plate electrode, and the electric field concentration in the vicinity of the outer peripheral edge within a range making Schottky contact is alleviated by a field plate effect. Due to this, the breakdown voltage of the semiconductor device is improved.

SUMMARY

The teachings herein provide a new structure that further improves breakdown voltage of a semiconductor device, and a manufacturing method thereof.

A structure of a semiconductor device disclosed herein may comprise a semiconductor substrate, in an upper surface of which a first region and a second region surrounding the first region are provided. The first region may be located higher than the second region, and the upper surface of the semiconductor substrate may further include a rising surface between the first region and the second region. A Schottky electrode that is in Schottky contact with the upper surface of the semiconductor substrate may be provided on the first region. An outer peripheral edge of the Schottky electrode may be located on the first region, and the rising surface may not be covered by the Schottky electrode. An insulating film may further be provided on the upper surface of the semiconductor substrate. The insulating film may extend annularly along the rising surface, and an inner peripheral edge of the insulating film may be located on the Schottky electrode and an outer peripheral edge of the insulating film may be located on the second region. A field plate electrode may be provided on the insulating film. The field plate electrode may be electrically connected with the Schottky electrode and faces the upper surface of the semiconductor substrate via the insulating film within an area extending from the outer peripheral edge of the Schottky electrode to the second region over the rising surface.

In the aforementioned structure, the upper surface of the semiconductor substrate includes a mesa structure, and the field plate electrode is provided in the area extending from the outer peripheral edge of the Schottky electrode, over the rising surface, and reaching the second region. According to such a structure, a depletion layer easily spreads from the outer peripheral edge of the Schottky electrode, beyond the rising surface, and into the second region when an inversed bias voltage is applied between the semiconductor substrate and the Schottky electrode. Due to this, electric field concentration in a vicinity of the outer peripheral edge of the Schottky electrode is alleviated, and breakdown voltage of the semiconductor device is further improved.

The teachings herein further disclose a method of manufacturing the aforementioned semiconductor device. This method may comprise: preparing an n-type semiconductor substrate that comprises a first region and a second region in an upper surface of the semiconductor substrate, wherein the second region surrounds the first region; forming a Schottky electrode at least on the first region of the upper surface of the semiconductor substrate such that the Schottky electrode is in Schottky-contact with the upper surface of the semiconductor substrate; etching the second region of the upper surface of the semiconductor substrate such that the first region becomes higher than the second region, a rising surface is formed between the first region and the second region, and an outer peripheral edge of the Schottky electrode is located on the first region; forming an insulating film on the upper surface of the semiconductor substrate, wherein the insulating film annularly extends along the rising surface, an inner peripheral edge of the insulating film is located on the Schottky electrode and an outer peripheral edge of the insulating film is located on the second region; and forming a field plate electrode, wherein the field plate electrode is electrically connected with the Schottky electrode and faces the upper surface of the semiconductor substrate via the insulating film within an area extending from the outer peripheral edge of the Schottky electrode to the second region over the rising surface. According to this manufacturing method, the semiconductor device with superior breakdown voltage as aforementioned can be manufactured.

BRIEF DESCRIPTION OF DRAWINGS

FIG. 11 is a diagram explaining a process in forming an insulating film 20 (S18), and shows the semiconductor substrate 12 in which the insulating film 20 is formed over an entirety of an upper surface 12a.

FIG. 13 is a diagram explaining a process in forming a contact electrode 18 (S20), and shows the semiconductor substrate 12 in which the contact electrode 18 is formed over the entirety of an upper surface 12a.

FIG. 15 is a diagram explaining a process in forming a protective film 22 (S22), and shows the semiconductor substrate 12 in which the protective film 22 is formed over the entirety of the upper surface 12a.

FIG. 22 is a diagram explaining a process in forming an insulating film 20 (S118), and shows the semiconductor substrate 12 in which the insulating film 20 is formed over an entirety of an upper surface 12a.

DETAILED DESCRIPTION

A structure and a manufacturing method of the present disclosure can be applied to a semiconductor device that uses a semiconductor in which formation of a p-type region is difficult. Generally, a guard ring structure having a p-type guard ring region is known as one of structures that can improve breakdown voltage of a semiconductor device. However, employment of the guard ring structure is difficult with a semiconductor in which a p-type region cannot easily be formed. In regard to this, the structure and the manufacturing method of the present disclosure does not require the formation of a p-type region, thus can be said as being effective for a semiconductor in which the formation of a p-type region is difficult. As a semiconductor in which the formation of a p-type region is difficult, oxide semiconductors such as gallium oxide ($Ga_2O_3$) may be exemplified. Especially with an oxide semiconductor in which a Conduction Band Minimum (CBM) of the oxide semiconductor is lower than −4.0 eV and a Valence Band Maximum (VBM) of the oxide semiconductor is lower than −6.0 eV with a vacuum level as a reference, the formation of the p-type region is difficult. However, the structure and the manufacturing method of the present disclosure can further be applied suitably to a semiconductor device that uses other semiconductors, for example the gallium nitride (GaN).

In an embodiment, formation of an insulating film may be performed by a mist CVD (Chemical Vapor Deposition) method. The insulating film is formed over both a first region and a second region, between which a rising surface is provided. Generally, it is difficult for uniformly form the insulating film on a front surface having such a surface level difference. In this regard, the mist CVD method is suitable for film deposition on such front surface with the surface level difference, and thus can effectively be employed in the formation of the insulating film in the present disclosure.

In an embodiment, formation of a Schottky electrode may form the Schottky electrode on the second region as well. In this case, etching of the second region may preferably remove the Schottky electrode formed on the second region as well. According to such a configuration, patterning of the Schottky electrode and formation of a mesa structure of a semiconductor substrate are performed in a same step, so a manufacturing error (that is, a difference from aimed design) that may occur in a positional relationship between the Schottky electrode and the mesa structure of the semiconductor substrate can be suppressed.

In an embodiment, preparation of the semiconductor substrate may prepare a semiconductor substrate including an n-type drift layer, and an n-type high resistivity layer that is lower in carrier density than the drift region. This semiconductor substrate may have the drift layer and the high resistivity layer as parts of its upper surface, with the high resistivity layer surrounding the drift region in the upper surface, and a boundary of the first region and the second region may be located on the high resistivity layer. According to such a configuration, an outer peripheral edge of the Schottky electrode comes to be located on the high resistivity layer, and a semiconductor device with greater superiority in breakdown voltage can be manufactured.

In the aforementioned embodiment, the preparation of the semiconductor substrate may include forming the drift layer by epitaxial growth; etching a part of the drift layer to form a groove at a position where the high resistivity layer is to be formed; and forming the high resistivity layer within the groove by epitaxial growth. In this case, although not particularly limited, the epitaxial growth of the high resistivity layer may be performed by a mist CVD method. By using the mist CVD method, an epitaxial growth layer that is free of voids or gaps can be formed even within the groove that has corners.

Alternatively, as another embodiment, an ion-implantation of impurities to the upper surface of the semiconductor substrate may further be included between the etching of the second region and the formation of the insulating film. Here, the ion-implantation may be performed with a use of the Schottky electrode as a mask, and the impurities may have a property of reducing carrier density of the semiconductor substrate. In this case, the impurities may be implanted along a direction angled from a normal direction of the first region of the semiconductor substrate so as to be implanted under the Schottky electrode. According to such a configuration, the aforementioned high resistivity layer can be formed by the ion-implantation. Since the Schottky electrode can be used as the mask therefor, manufacturing error (that is, a difference from aimed design) that may occur in a positional relationship between the Schottky electrode and the high resistivity layer can be suppressed.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

First Embodiment

A semiconductor device 10 and a manufacturing method thereof of a first embodiment will be described with reference to the drawings. The semiconductor device 10 is one type of power semiconductor device, and can be employed in a circuit for supplying power to a motor that drives wheels in an electrically-driven vehicle such as an electric vehicle, a hybrid vehicle, and a fuel cell vehicle. It should be noted that technical elements disclosed in this embodiment is not limited to the semiconductor device 10 and the manufacturing method thereof, and they may be applied to various other semiconductor devices and manufacturing methods thereof. Hereinbelow, a configuration of the semiconductor device 10 will be described first, and then the manufacturing method of the semiconductor device 10 will be described.

Figure 1:
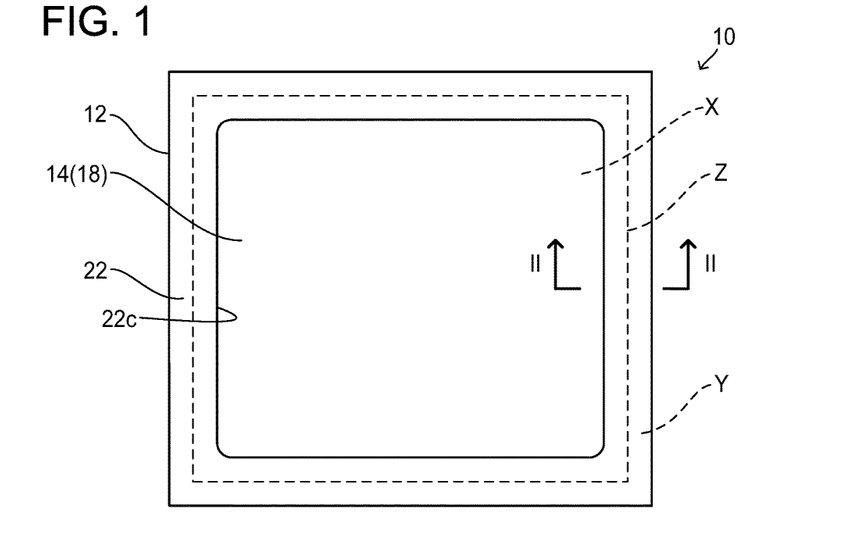
FIG. 1 is a plan view of a semiconductor device 10.
Figure 2:
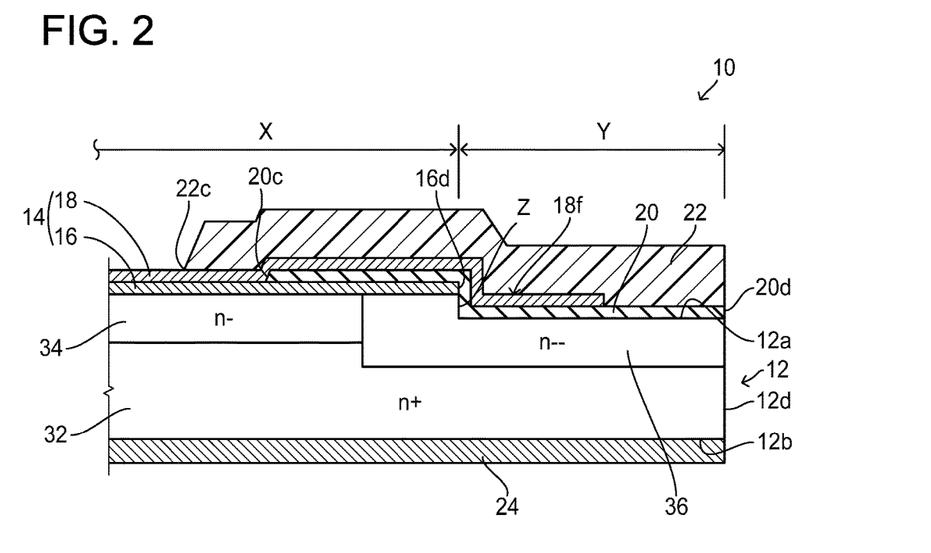
FIG. 2 is a cross-sectional view along a line II-II of FIG. 1, and schematically shows a structure related to breakdown voltage of the semiconductor device 10.

As shown in FIGS. 1 and 2, the semiconductor device 10 includes a semiconductor substrate 12, an upper electrode 14, an insulating film 20, a protective film 22, and a lower electrode 24. The upper electrode 14, the insulating film 20, and the protective film 22 are provided on an upper surface 12a of the semiconductor substrate 12, and the lower electrode 24 is provided on a lower surface 12b of the semiconductor substrate 12. The upper electrode 14 includes a Schottky electrode 16 and a contact electrode 18. The contact electrode 18 is provided on the Schottky electrode 16, and is electrically connected to the Schottky electrode 16. An outer peripheral portion 18f of the contact electrode 18 faces the semiconductor substrate 12 via the insulating film 20, and functions as a field plate electrode. This field plate electrode 8f faces the upper surface 12a of the semiconductor substrate 12 on an outer side than outer peripheral edges 16d (one of which is shown on the right side in FIG. 2) of the Schottky electrode 16 via the insulating film 20.

The upper surface 12a of the semiconductor substrate 12 has a mesa structure. Specifically, the upper surface 12a of the semiconductor substrate 12 includes a first region X and a second region Y surrounding the first region X, and has the first region X at a higher level than the second region Y. In other words, the first region X protrudes upward than the second region Y. The first region X and the second region Y are parallel to each other, and are also parallel to the lower surface 12b of the semiconductor substrate 12. Rising surfaces Z are provided between the first region X and the second region Y. The rising surfaces Z are sloped surfaces or vertical surfaces connecting the first region X and the second region Y that have a height difference, and are surfaces forming angles with respect to the first region X and the second region Y.

The semiconductor substrate 12 is an n-type semiconductor substrate. The semiconductor substrate 12 of the present embodiment is, although it is not particularly limited, a gallium oxide ($Ga_2O_3$) substrate. The semiconductor substrate 12 includes an n-type ohmic contact layer 32, a drift layer 34 having lower carrier density than the ohmic contact layer 32, and a high resistivity layer 36 having lower carrier density than the drift layer 34. The ohmic contact layer 32 is located in a lower layer of the semiconductor substrate 12, and constitutes the lower surface 12b of the semiconductor substrate 12. The drift layer 34 and the high resistivity layer 36 are provided on the ohmic contact layer 32, and constitute the upper surface 12a of the semiconductor substrate 12. In the upper surface 12a of the semiconductor substrate 12, the high resistivity layer 36 surrounds the drift layer 34, and the rising surfaces Z between the first region X and the second region Y is located on the high resistivity layer 36. In other words, the high resistivity layer 36 is provided in an area extending from the first region X to the second region Y over the rising surfaces Z. In this embodiment, the high resistivity layer 36 makes direct contact with the ohmic contact layer 32, however, in other embodiments, the drift layer 34 may be interposed between the high resistivity layer 36 and the ohmic contact layer 32. Alternatively, the high resistivity layer 36 is not a required constituent feature, so it may be omitted as needed.

The Schottky electrode 16 is provided on the first region X, and is in Schottky contact with the upper surface 12a of the semiconductor substrate 12. The outer peripheral edges 16d of the Schottky electrode 16 are located on the first region X. That is, the rising surfaces Z are not covered by the Schottky electrode 16. A material of the Schottky electrode 16 may simply be a material that can make Schottky contact with the upper surface 12a of the semiconductor substrate 12, and thus it is not particularly limited, however, it may for example be platinum (Pt).

The insulating film 20 extends annularly along the rising surfaces Z. Inner peripheral edges 20c of the insulating film 20 are located on the Schottky electrode 16, and outer peripheral edges 20d of the insulating film 20 are located on the second region Y. Although this is an example, the insulating film 20 of the embodiment reaches side surfaces 12d of the semiconductor substrate 12, and covers an entirety of the second region Y. A material of the insulating film 20 may simply be a material with desired insulation and thus it is not particularly limited, however, it may for example be aluminum oxide ($Al_2O_3$).

An outer peripheral portion of the contact electrode 18 is located on the insulating film 20, and as aforementioned, it functions as the field plate electrode 18f. On the other hand, a central portion of the contact electrode 18 is in direct contact with the Schottky electrode 16 through an opening defined by the inner peripheral edges 20c of the insulating film 20. Due to this, the field plate electrode 18f is electrically connected to the Schottky electrode 16. The field plate electrode 18f faces the upper surface 12a of the semiconductor substrate 12 via the insulating film 20 in a vicinity of the outer peripheral edges 16d of the Schottky electrode 16. Specifically, the field plate electrode 18f faces the upper surface 12a of the semiconductor substrate 12 via the insulating film 20 in an area ranging from the outer peripheral edges 16d of the Schottky electrode 16, over the rising surfaces Z, and reaching the second region Y. A material of the contact electrode 18 (that is, of the field plate electrode 18f) is not particularly limited, however, it may for example be gold (Au). Alternatively, the contact electrode 18 may have a laminate structure including layers of titanium (Ti), nickel (Ni), and gold.

The protective film 22 extends annularly along edges of the semiconductor substrate 12, and covers an outer peripheral portion of the upper electrode 14 and the insulating film 20. An outer peripheral edge 22c of the protective film 22 defines an opening through which the upper electrode 14 can be exposed. A material of the protective film 22 simply needs to be an insulative material, and thus is not particularly limited, and it may for example be a polymer material such as polyimide.

The lower electrode 24 is in ohmic contact with the lower surface 12b of the semiconductor substrate 12. A material of the lower electrode 24 may simply be a material that can make ohmic contact with the lower surface 12b of the semiconductor substrate 12, and thus is not particularly limited. The lower electrode 24 of the present embodiment makes contact with the entire lower surface 12b of the semiconductor substrate 12, however, as other embodiments, the lower electrode 24 may make contact with only a part of the lower surface 12b of the semiconductor substrate 12.

According to the aforementioned structure, the semiconductor device 10 of the present embodiment is provided with a Schottky barrier diode (hereafter referred to simply as a diode) which uses the upper electrode 14 as an anode and the lower electrode 12b as a cathode. In this diode, the upper surface 12a of the semiconductor substrate 12 has the mesa structure, and the field plate electrode 18f is provided in the area ranging from the outer peripheral edges 16d of the Schottky electrode 16, over the rising surfaces Z, and reaching the second region Y. According to such a structure, a depletion layer can easily spread from the outer peripheral edges 16d of the Schottky electrode 16, over the rising surfaces Z, and to the second region Y when an inversed bias voltage is applied between the semiconductor substrate 12 and the Schottky electrode 16. As a result, electric field concentration in a vicinity of the outer peripheral edges 16d of the Schottky electrode 16 is greatly alleviated, and breakdown voltage of the semiconductor device 10 greatly improves. Especially when the semiconductor substrate 12 includes the high resistivity layer 36, and the outer peripheral edges 16d of the Schottky electrode 16 are located on the high resistivity layer 36 as in the semiconductor device 10 of the present embodiment, this allows the aforementioned depletion layer to spread easier, and the breakdown voltage of the semiconductor device 10 further improves.

Figure 3:
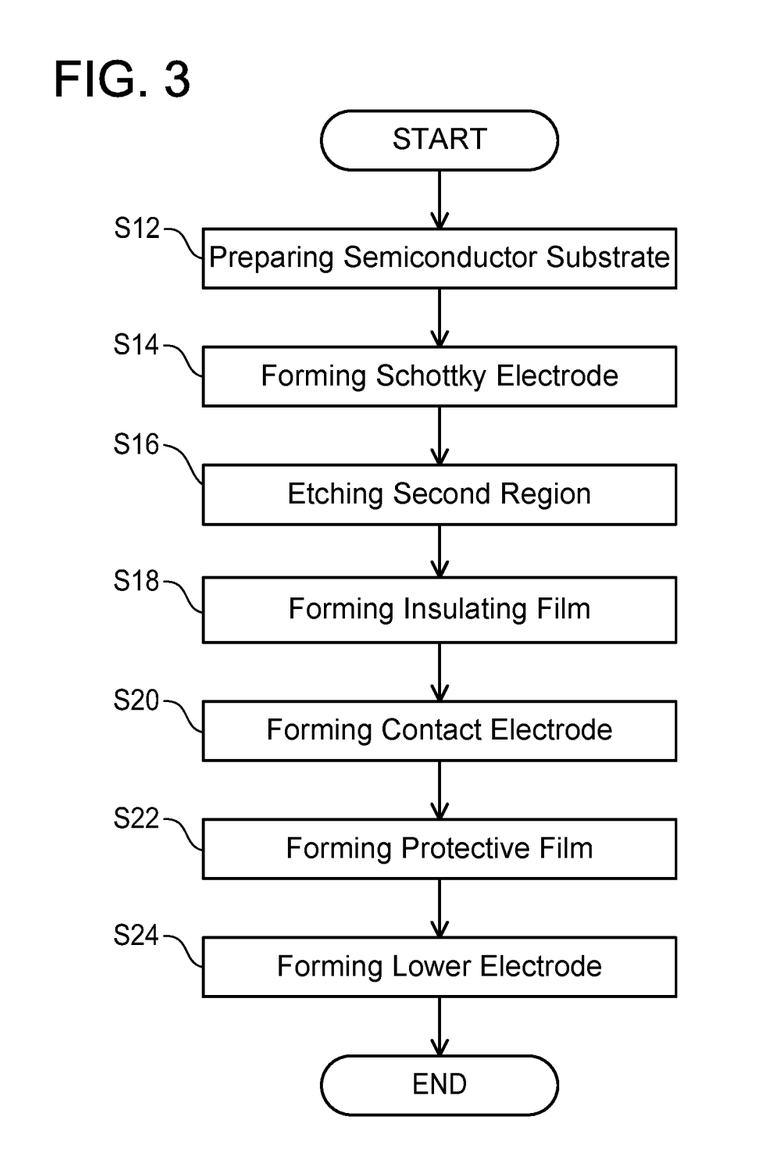
FIG. 3 is a flowchart showing a flow of a manufacturing method of a semiconductor device 10 of a first embodiment.
Figure 7:
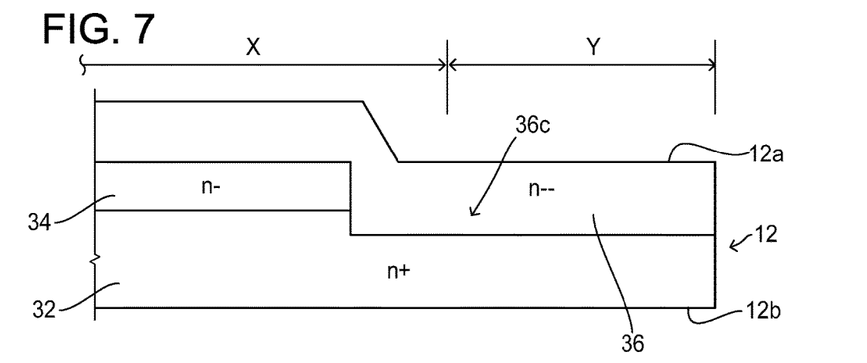
FIG. 7 is a diagram explaining a process in preparing the semiconductor substrate 12 (S12), and shows the semiconductor substrate 12 in which the high resistivity layer 36 is formed by epitaxial growth.
Figure 8:
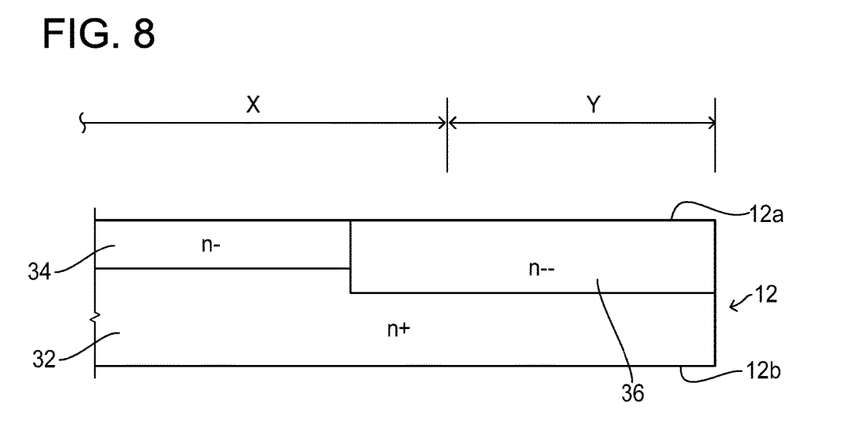
FIG. 8 is a diagram explaining a process in preparing the semiconductor substrate 12 (S12), and shows the semiconductor substrate 12 in which an excessive portion of the high resistivity layer 36 is removed.

Next, a manufacturing method of a semiconductor device 10 will be described. FIG. 3 is a flow chart showing a flow of the manufacturing method of the present embodiment. Firstly, in step S12, a semiconductor substrate 12 is prepared. In this step, although not particularly limited, the semiconductor substrate 12 provided with an ohmic contact layer 32, a drift layer 34, and a high resistivity layer 36 as shown in FIG. 8 is prepared according to processes shown in FIGS. 4 to 8.

Figure 4:
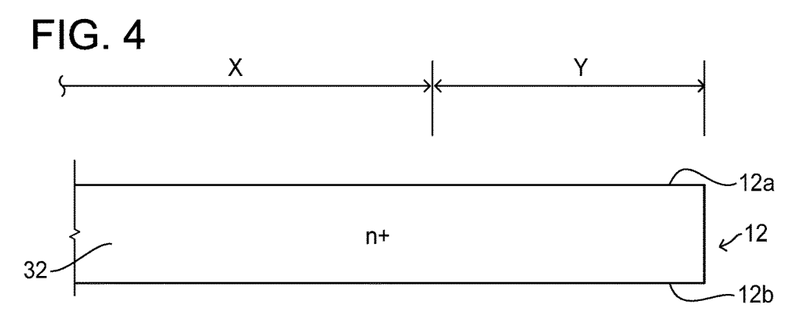
FIG. 4 is a diagram explaining a process in preparing a semiconductor substrate 12 (S12), and shows an initial state of the semiconductor substrate 12.
Figure 5:
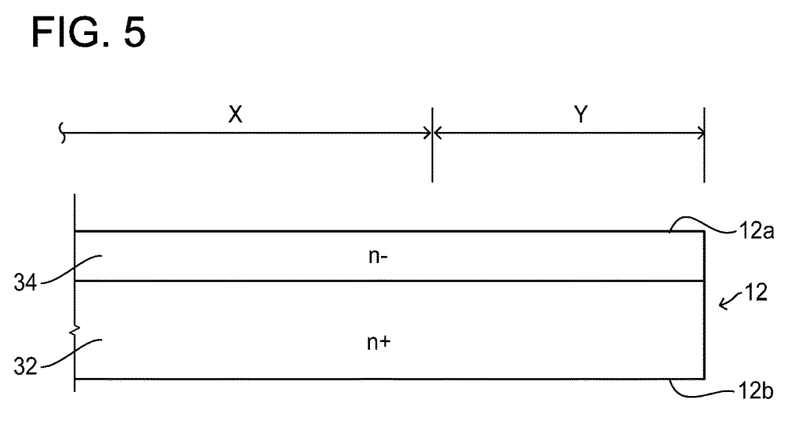
FIG. 5 is a diagram explaining a process in preparing the semiconductor substrate 12 (S12), and shows the semiconductor substrate 12 in which a drift layer 34 is formed.

Firstly, as shown in FIG. 4, the semiconductor substrate 12 that only includes the ohmic contact layer 32 is prepared. As aforementioned, the semiconductor substrate 12 may be a gallium oxide substrate. Washing and other processes are performed on the semiconductor substrate 12 as needed. Next, as shown in FIG. 5, the drift layer 34 is formed on the ohmic contact layer 32. The drift layer 34 is formed over an entirety of the ohmic contact layer 32. This drift layer 34 is not particularly limited, but may be formed by epitaxially growing gallium oxide. This epitaxial growth may be performed for example by an MOCVD (Metal Organic Chemical Vapor Deposition) method or an HVPE (Hydride Vapor Phase Epitaxy) method. Alternatively, the epitaxial growth of the drift layer 34 may be performed by a mist CVD method.

Figure 6:
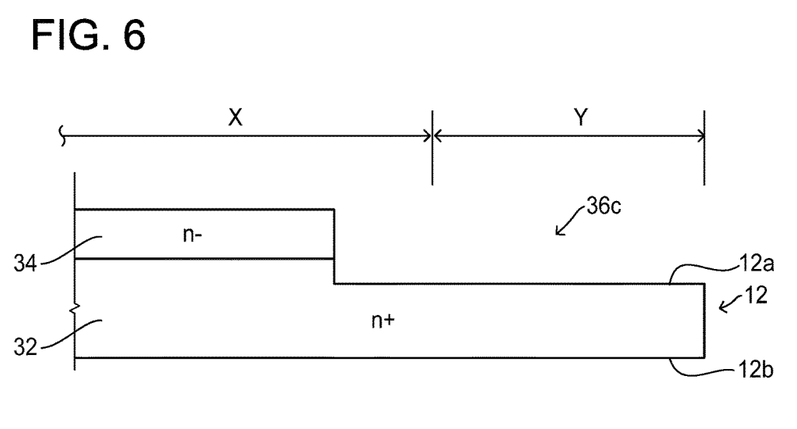
FIG. 6 is a diagram explaining a process in preparing the semiconductor substrate 12 (S12), and shows the semiconductor substrate 12 in which a groove 36c is formed at a position corresponding to a high resistivity layer 36.

Next, as shown in FIG. 6, a part of the drift layer 34 is etched so that a groove 36c is formed at a position where the high resistivity layer 36 is to be formed. Then, as shown in FIG. 7, the high resistivity layer 36 is formed within the groove 36c. At this stage, the high resistivity layer 36 may be formed over the entirety of an upper surface 12a of the semiconductor substrate 12 instead of being formed only within the groove 36c. The high resistivity layer 36 may be performed by epitaxial growth of gallium oxide. Further, although it is not particularly limited, this epitaxial growth may be performed by the mist CVD method. When the mist CVD method is used, a raw material thereof (which is herein gallium oxide) is conveyed in a mist form, so an epitaxial growth layer that is free of voids or gaps can be formed within a short period of time even in the groove 36c that has corners.

In the epitaxial growth of the high resistivity layer 36, as compared to the epitaxial growth of the drift layer 34, impurities of iron (Fe) and/or magnesium (Mg) may preferably be added. Addition of these impurities suppresses a carrier density of the high resistivity layer 36 lower than that of the drift layer 34, and increases resistivity thereof. It should be noted that the impurities are not limited to certain types of substances, and they may be any substance that may suppress the carrier density of the n-type drift layer 34 low. Alternatively, a concentration of the n-type impurities to be added may simply be lowered. Next, as shown in FIG. 8, excessive high resistivity layer 36 is removed to planarize the upper surface 12a of the semiconductor substrate 12. Although it is not particularly limited, this planarization can be performed by a CMP (Chemical Mechanical Polishing) method. The planarized upper surface 12a of the semiconductor substrate 12 has the drift layer 32 and the high resistivity layer 34 exposed thereon, and the high resistivity layer 34 surrounds the drift layer 32. According to the above, the semiconductor substrate 12 including the ohmic contact layer 32, the drift layer 34, and the high resistivity layer 36 is prepared.

Figure 9:
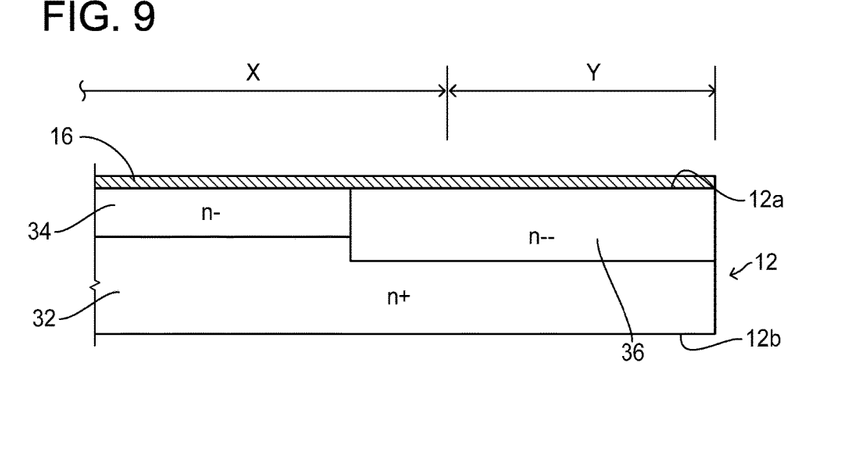
FIG. 9 is a diagram explaining forming a Schottky electrode 16 (S14).

Returning to FIG. 3, in step S14, a Schottky electrode 16 is formed on the upper surface 12a of the semiconductor substrate 12. As shown in FIG. 9, at this stage, the Schottky electrode 16 is formed over the entirety of the upper surface 12a including a first region X and a second region Y. In other embodiments, the Schottky electrode 16 may selectively be formed only on the first region X. In such cases, the Schottky electrode 16 simply needs to establish Schottky contact with the upper surface 12a of the semiconductor substrate 12 at least in the first region X. As aforementioned, a material of the Schottky electrode 16 may for example be platinum.

Figure 10:
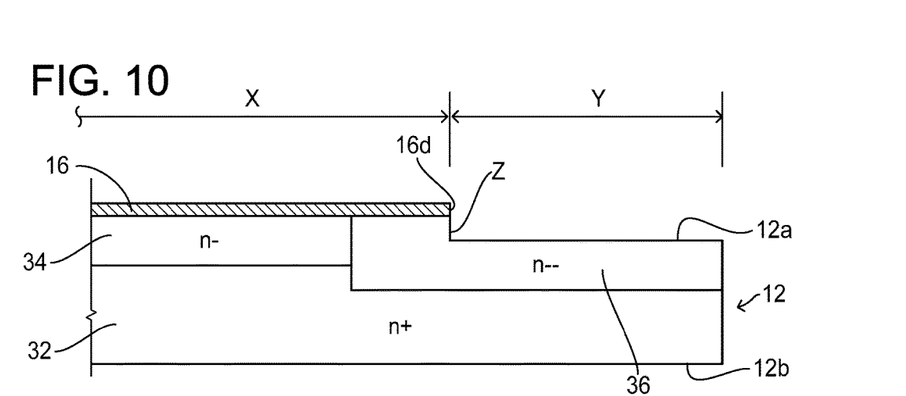
FIG. 10 is a diagram explaining etching a second region Y (S16).

In step S16 of FIG. 3, the second region Y of the upper surface 12a of the semiconductor substrate 12 is etched. Due to this, as shown in FIG. 10, the first region X in the upper surface 12a of the semiconductor substrate 12 becomes higher than the second region Y therein, and rising surfaces Z are formed between the first region X and the second region Y. In this step, not only the semiconductor substrate 12 in the second region Y but also the Schottky electrode 16 on the second region Y is also removed. As above, when the patterning of the Schottky electrode 16 and the formation of the mesa structure of the semiconductor substrate 12 are performed in one step, a manufacturing error (that is, a difference from aimed design) that may occur in a positional relationship between the Schottky electrode 16 and the mesa structure of the semiconductor substrate 12 can be suppressed.

Figure 11:
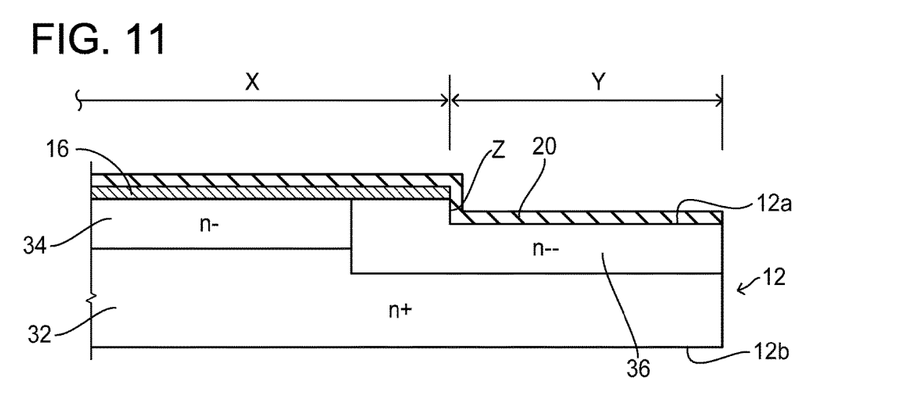
Figure 12:
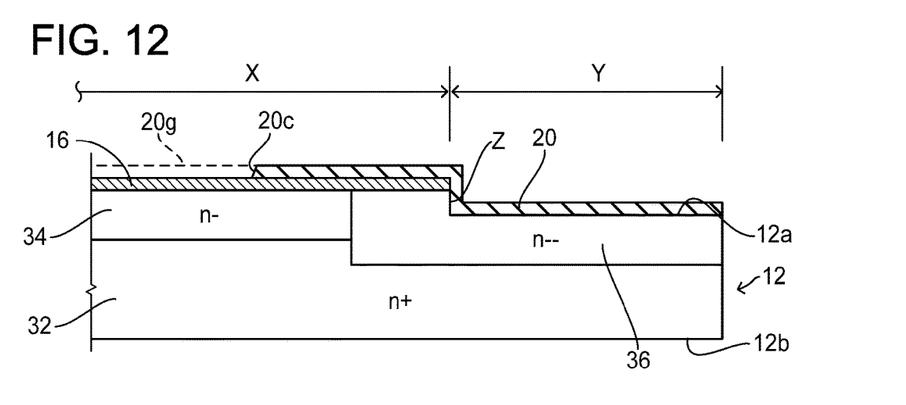
FIG. 12 is a diagram explaining a process in forming the insulating film 20 (S18), and shows the semiconductor substrate 12 in which the insulating film 20 is patterned.

In step S18 of FIG. 3, an insulating film 20 is formed on the upper surface 12a of the semiconductor substrate 12. The formation of the insulating film 20 is not particularly limited, however, it may be performed by processes shown in FIGS. 11 and 12. Firstly, as shown in FIG. 11, the insulating film 20 is formed on the upper surface 12a of the semiconductor substrate 12. The formation of the insulating film 20 can for example be performed by a mist CVD method. According to the mist CVD method, material of the insulating film 20 (for example, aluminum oxide) is conveyed in a mist form, so the insulating film 20 that is free of voids or gaps can be formed on the upper surface 12a of the semiconductor substrate 12, which includes corners with the rising surfaces Z. Then, as shown in FIG. 12, a central portion 20g of the insulating film 20 is removed by etching to pattern the insulating film 20 in an annular shape. Due to this, the insulating film 20 is given an opening through which the Schottky electrode 16 can be accessed.

In the present embodiment, the insulating film 20 is formed after the Schottky electrode 16 has been formed. In other words, the Schottky electrode 16 is formed before the formation of the insulating film 20. According to such a procedure, the Schottky electrode 16 can be formed on the upper surface 12a of the semiconductor substrate 12 without risking the upper surface 12a of the semiconductor substrate 12 of receiving influences (such as damages and contamination) that may be caused by the formation and the etching of the insulating film 20. Due to this, a stable Schottky junction interface can be achieved between the upper surface 12a of the semiconductor substrate 12 and the Schottky electrode 16.

Figure 13:
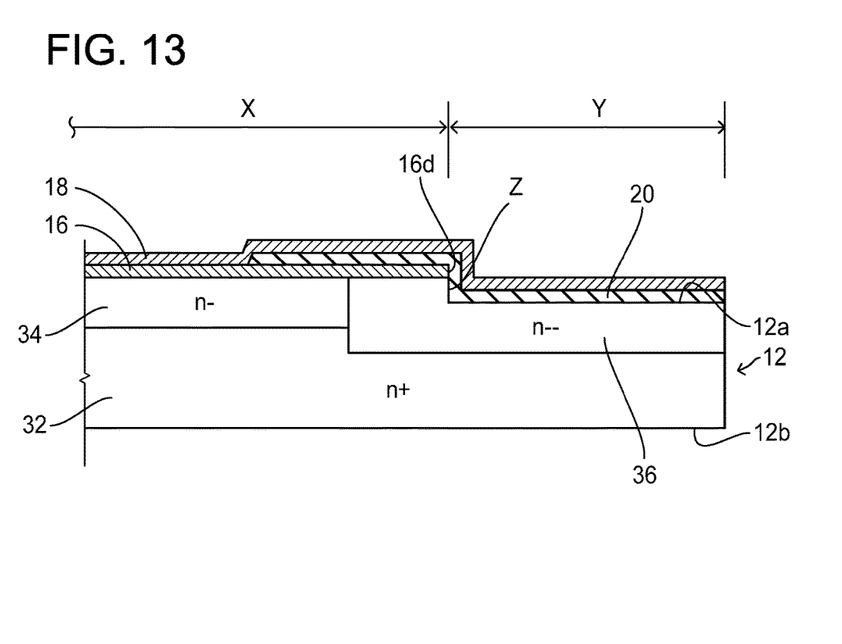
Figure 14:
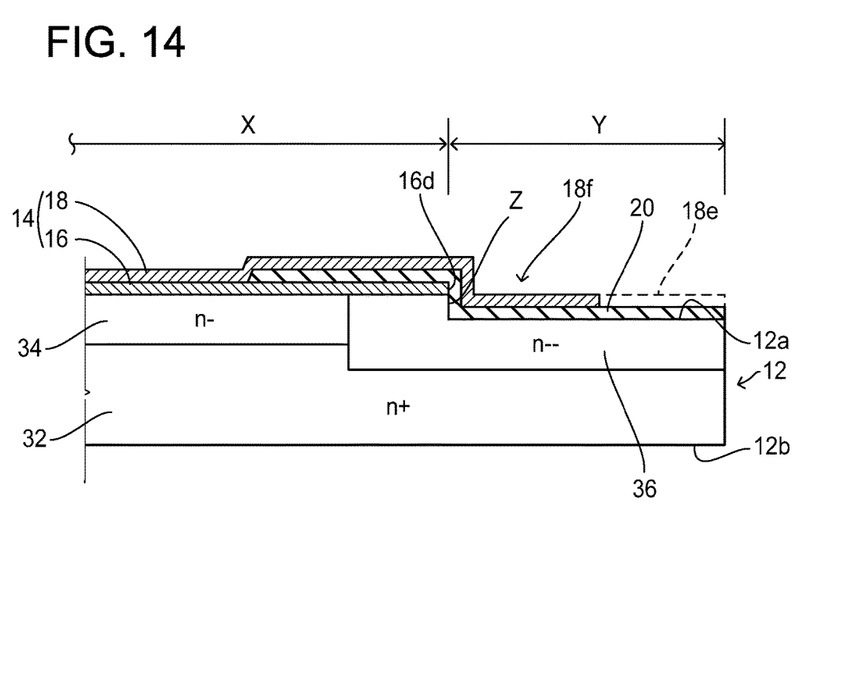
FIG. 14 is a diagram explaining a process in forming the contact electrode 18 (S20), and shows the semiconductor substrate 12 in which the contact electrode 18 is patterned.

In step S20 of FIG. 3, a contact electrode 18 is formed above the upper surface 12a of the semiconductor substrate 12. The formation of the contact electrode 18 is not particularly limited, however, it may be performed by processes shown in FIGS. 13 and 14. Firstly, as shown in FIG. 13, the contact electrode 18 is formed over the entirety of the upper surface 12a of the semiconductor substrate 12. As aforementioned, material of the contact electrode 18 may for example be gold. Alternatively, the material of the contact electrode 18 may have a laminate structure of plural types of metals. Then, as shown in FIG. 14, a portion 18e of the contact electrode 18 is removed by etching. Due to this, the contact electrode 18 is patterned to its desired shape. A part of the contact electrode 18 is a field plate electrode 18f, and this process is therefore a process to form the field plate electrode 18f as well.

Figure 15:
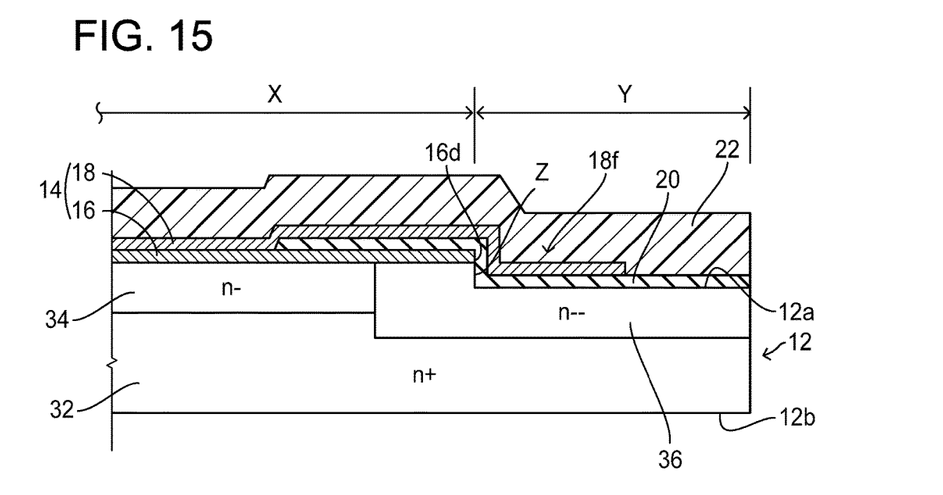
Figure 16:
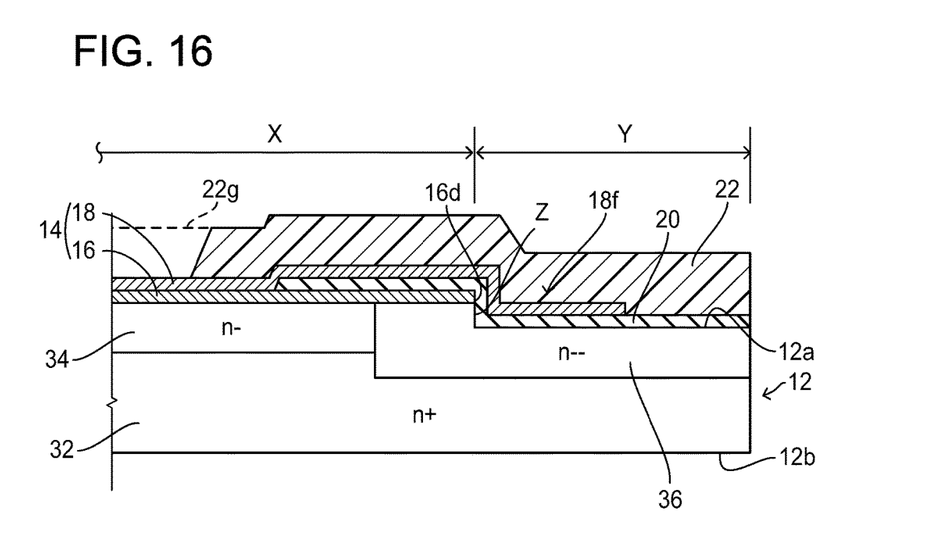
FIG. 16 is a diagram explaining a process in forming the protective film 22 (S22), and shows the semiconductor substrate 12 in which the protective film 22 is patterned.

In step S22 of FIG. 3, a protective film 22 is formed on the upper surface 12a of the semiconductor substrate 12. The formation of the protective film 22 is not particularly limited, however, it may be performed by processes shown in FIGS. 15 and 16. Firstly, as shown in FIG. 15, the protective film 22 is formed over the entirety of the upper surface 12a of the semiconductor substrate 12. As aforementioned, material of the protective film 22 is the insulative material, and may for example be polyimide. Then, as shown in FIG. 16, a central portion 22g of the protective film 22 is removed by etching. Due to this, the protective film 22 is patterned into an annular shape.

In step S24 of FIG. 3, a lower electrode 24 is formed on the lower surface 12b of the semiconductor substrate 12. Due to this, the structure of the semiconductor device 10 shown in FIGS. 1 and 2 is completed. Normally, a plurality of semiconductor devices 10 is simultaneously manufactured on one piece of semiconductor wafer, and dicing to separate the semiconductor wafer into the plurality of semiconductor devices 10 is performed.

The structure of the semiconductor device 10 and the manufacturing method thereof as described in this embodiment are not limited to semiconductor devices that use gallium oxide as a material, but may suitably be applied to those that use other types of semiconductor materials. It should be noted that, gallium oxide is known as a substance in which a p-type region cannot easily be formed, so it is difficult to employ a guard ring structure that requires a p-type guard ring region in the semiconductor device 10 that uses the gallium oxide semiconductor substrate 12. In this regard, according to the structure and the manufacturing method of the present embodiment, the breakdown voltage of the semiconductor device 10 can be improved without having have to form the p-type region. Thus, the structure and the manufacturing method of the present embodiment can suitably be employed especially in a semiconductor device that uses a semiconductor material with which the formation of the p-type region is difficult. As such semiconductor materials, oxide semiconductors in which a Conduction Band Minimum (CBM) is lower than $-4.0$ eV and a Valence Band Maximum (VBM) is lower than $-6.0$ eV with a vacuum level as a reference may be exemplified.

Second Embodiment

Figure 17:
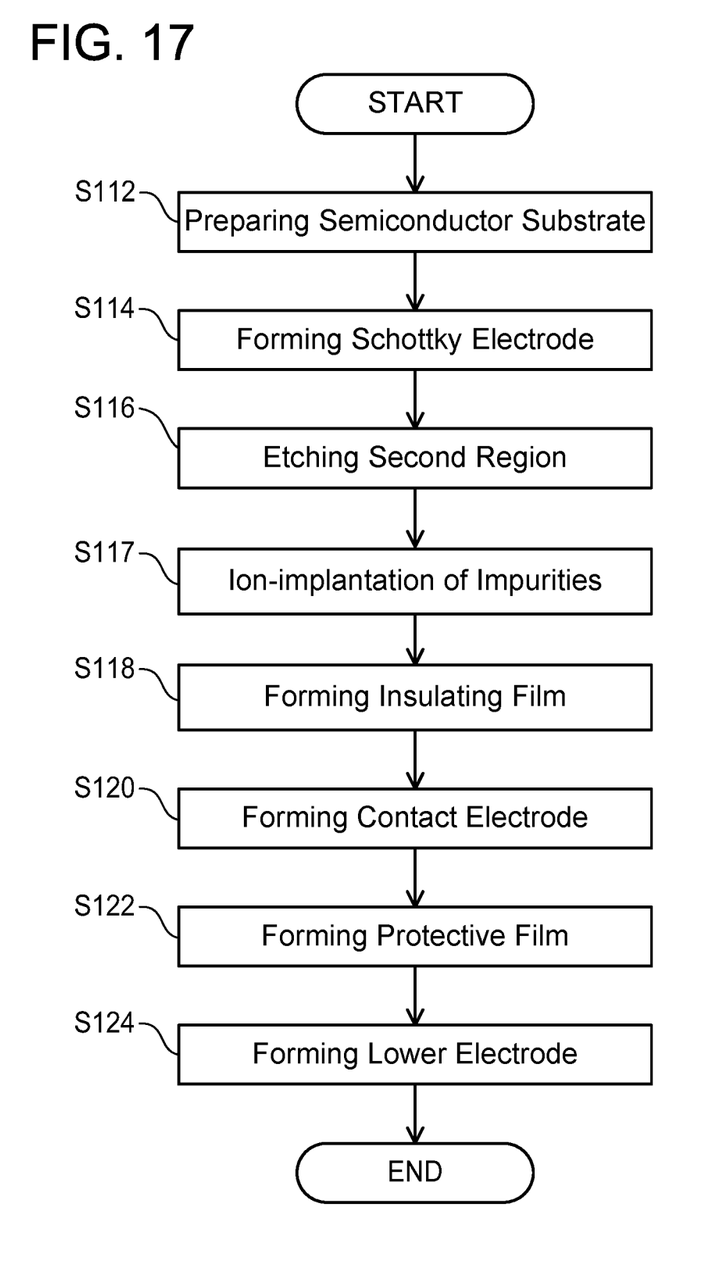
FIG. 17 is a flowchart showing a flow of a manufacturing method of a semiconductor device 10 of a second embodiment.
Figure 18:
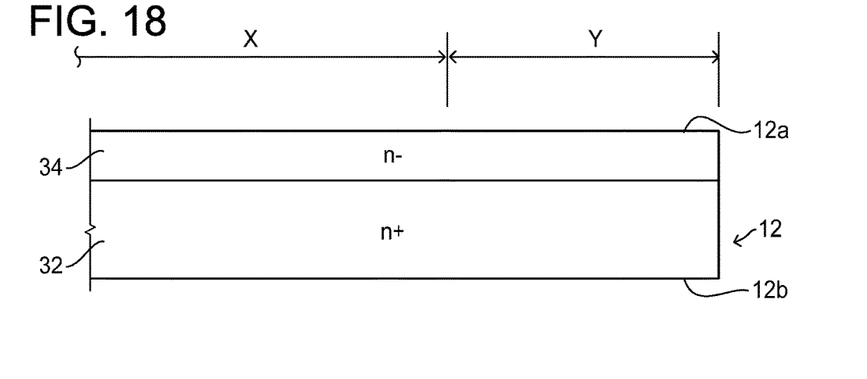
FIG. 18 is a diagram explaining preparing a semiconductor substrate 12 (S112).

Another embodiment of a manufacturing method of a semiconductor device 10 will be described. FIG. 17 is a flow chart showing a flow of the manufacturing method of the present embodiment. Firstly, in step S112, a semiconductor substrate 12 is prepared. In this step, unlike step S12 of the first embodiment, a semiconductor substrate 12 that includes an ohmic contact layer 32 and a drift layer 34 but does not include a high resistivity layer 36 as shown in FIG. 18 is prepared. Such a semiconductor substrate 12 may be prepared for example according to the procedure shown in FIGS. 4 and 5 of the first embodiment. Step S112 of the second embodiment corresponds to step S12 of the first embodiment, however, it differs from step S12 of the first embodiment in that the semiconductor substrate 12 does not have the high resistivity layer 36.

Figure 19:
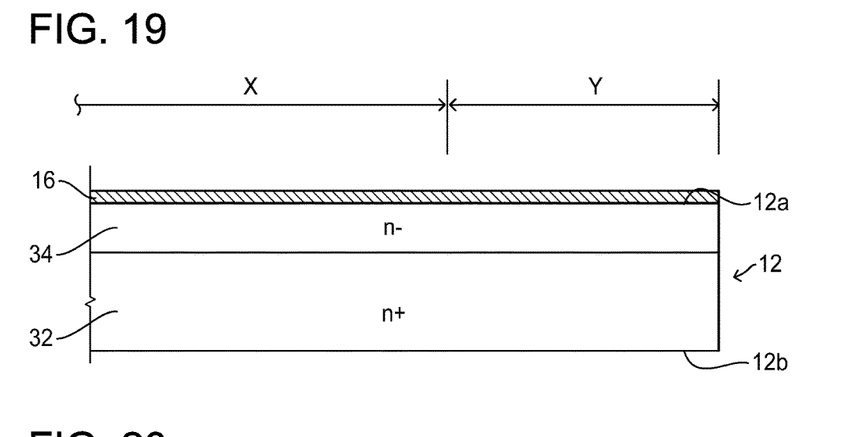
FIG. 19 is a diagram explaining forming a Schottky electrode 16 (S114).

In step S114 of FIG. 17, a Schottky electrode 16 is formed on an upper surface 12a of the semiconductor substrate 12. As shown in FIG. 19, at this stage, the Schottky electrode 16 is formed over an entirety of the upper surface 12a including a first region X and a second region Y. However, in other embodiments, the Schottky electrode 16 may selectively be formed only on the first region X. In such cases, the Schottky electrode 16 simply needs to establish Schottky contact with the upper surface 12a of the semiconductor substrate 12 at least in the first region X. As aforementioned, a material of the Schottky electrode 16 may for example be platinum. Step S114 of the second embodiment corresponds to step S14 of the first embodiment, and thus it can be performed in a same manner as step S14 of the first embodiment.

Figure 20:
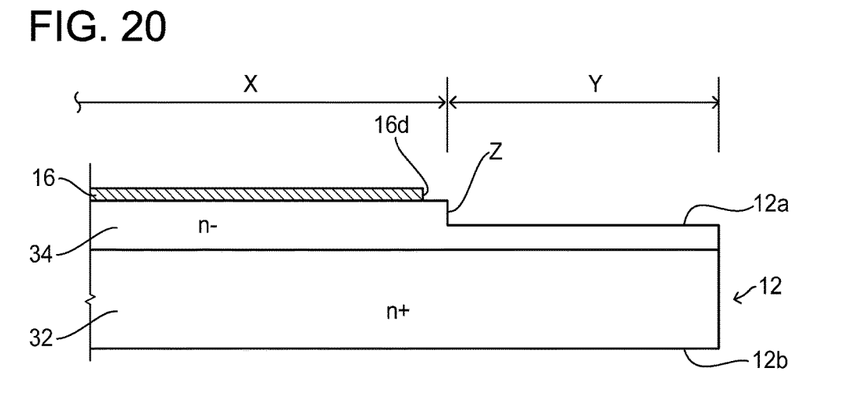
FIG. 20 is a diagram explaining etching a second region Y (S116).

In step S116 of FIG. 17, the second region Y of the upper surface 12a of the semiconductor substrate 12 is etched. Due to this, as shown in FIG. 20, the first region X in the upper surface 12a of the semiconductor substrate 12 becomes higher than the second region Y therein, and rising surfaces Z are formed between the first region X and the second region Y. In this step, not only the semiconductor substrate 12 in the second region Y but also the Schottky electrode 16 on the second region Y is also removed. Due to this, as described in the first embodiment, a manufacturing error (that is, a difference from aimed design) that may occur in a positional relationship between the Schottky electrode 16 and a mesa structure of the semiconductor substrate 12 can be suppressed. Here, some parts of the Schottky electrode 16 located on the first region X may further be removed so that outer peripheral edges 16d of the Schottky electrode 16 separate away from the rising surfaces Z. Step S116 of the second embodiment corresponds to step S16 of the first embodiment, and thus it can be performed in a same manner as step S16 of the first embodiment.

Figure 21:
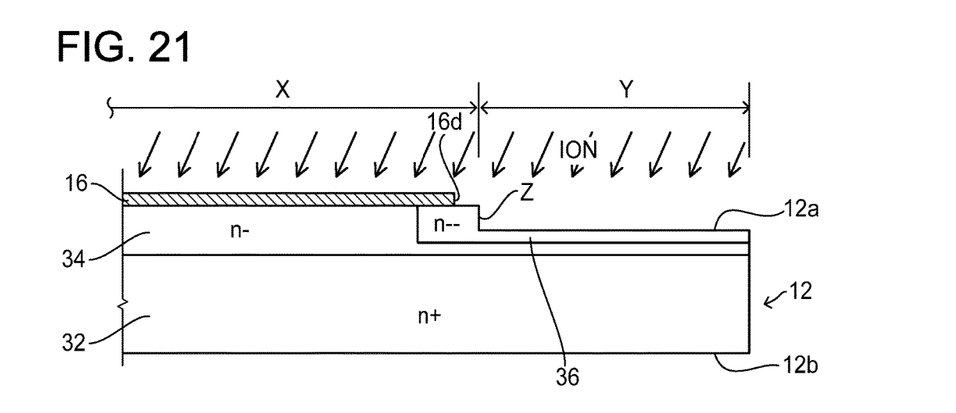
FIG. 21 is a diagram explaining performing ion-implantation of impurities (S117).

In step S117 of FIG. 17, impurities are ion-implanted to the upper surface 12a of the semiconductor substrate 12. In this ion-implantation, as shown in FIG. 21, the Schottky electrode 16 is used as a mask to implant the impurities into the rising surfaces Z and the second region Y that are not covered by the Schottky electrode 16. Arrows denoted "ION" in FIG. 21 schematically show the impurity ion-implantation. The impurities to be implanted are impurities that suppresses carrier density in the n-type semiconductor substrate 12 (which is herein the drift layer 34), and are not particularly limited, however, they are for example iron (Fe) and/or magnesium (Mg). Further, the impurities are implanted along a direction angled from a normal direction of the first region X (up and down direction in FIG. 21) so as to be implanted under the Schottky electrode 16. Due to this, the high resistivity layer 36 that is lower in carrier density than the drift region 34 is formed in the semiconductor substrate 12. Since the Schottky electrode 16 is used as the mask, a manufacturing error (that is, a difference from aimed design) that may occur in a positional relationship between the Schottky electrode 16 and the high resistivity layer 36 can be suppressed. In an example shown in FIG. 17, the drift layer 34 is interposed between the ohmic contact layer 32 and the high resistivity layer 36, however, in other embodiments, the high resistivity layer 36 may reach the ohmic contact layer 32. Step S117 of the second embodiment is a step that cannot be seen in the manufacturing method of the first embodiment.

Figure 22:
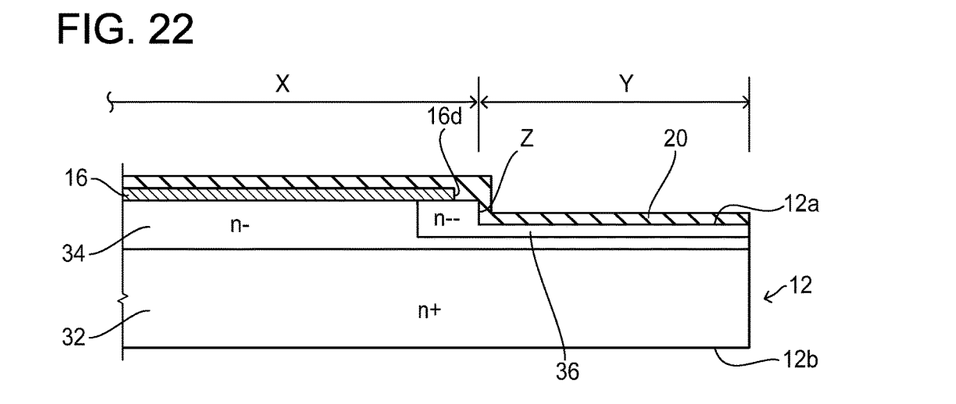
Figure 23:
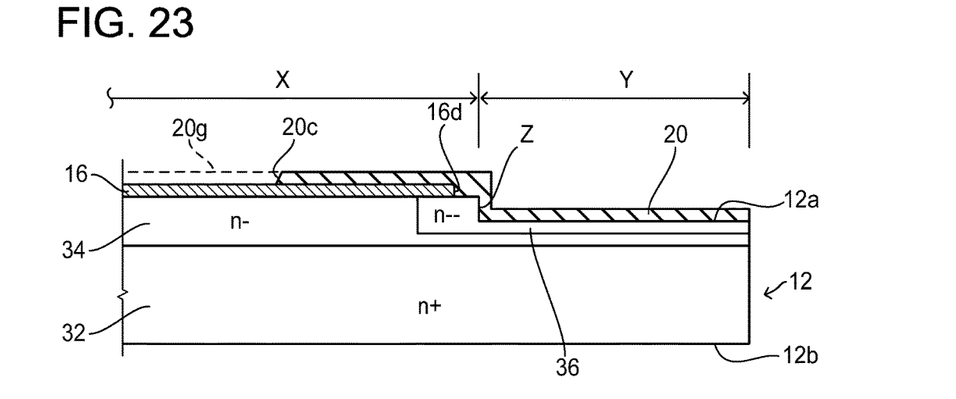
FIG. 23 is a diagram explaining a process in forming the insulating film 20 (S118), and shows the semiconductor substrate 12 in which the insulating film 20 is patterned.

In step S118 of FIG. 17, an insulating film 20 is formed on the upper surface 12a of the semiconductor substrate 12. The formation of the insulating film 20 is not particularly limited, however, it may be performed by processes shown in FIGS. 22 and 23. Firstly, as shown in FIG. 22, the insulating film 20 is formed over the entirety of the upper surface 12a of the semiconductor substrate 12. The formation of the insulating film 20 can for example be performed by the mist CVD method similar to the first embodiment. Then, as shown in FIG. 23, a central portion 20g of the insulating film 20 is removed by etching to pattern the insulating film 20 in an annular shape. Due to this, the insulating film 20 is given an opening through which the Schottky electrode 16 can be accessed. Step S118 of the second embodiment corresponds to step S18 of the first embodiment, and thus it can be performed in a same manner as step S18 of the first embodiment.

In step S120 of FIG. 17, a contact electrode 18 is formed on the upper surface 12a of the semiconductor substrate 12. The formation of the contact electrode 18 may be performed by processes shown in FIGS. 13 and 14, similar to step S20 of the first embodiment. In step S122 of FIG. 17, a protective film 22 is formed on the upper surface 12a of the semiconductor substrate 12. The formation of the protective film 22 may be performed by processes shown in FIGS. 15 and 16, similar to step S22 of the first embodiment. Then, in step S124 of FIG. 17, a lower electrode 24 is formed on a lower surface 12b of the semiconductor substrate 12, similar to step S24 of the first embodiment. Due to this, the structure of the semiconductor device 10 shown in FIGS. 1 and 2 (except for that the ohmic contact layer 32 and the high resistivity layer 36 make direct contact) is completed.

What is claimed is:

1. A method of manufacturing a semiconductor device, the method comprising:
    preparing an n-type semiconductor substrate that comprises a first region and a second region in an upper surface of the semiconductor substrate, wherein the second region surrounds the first region;
    forming a Schottky electrode at least on the first region of the upper surface of the semiconductor substrate such that the Schottky electrode is in Schottky-contact with the upper surface of the semiconductor substrate;
    etching the second region of the upper surface of the semiconductor substrate such that the first region becomes higher than the second region, a rising surface is formed between the first region and the second region, and an outer peripheral edge of the Schottky electrode is located on the first region;
    forming an insulating film on the upper surface of the semiconductor substrate, wherein the insulating film annularly extends along the rising surface, an inner peripheral edge of the insulating film is located on the Schottky electrode and an outer peripheral edge of the insulating film is located on the second region; and
    forming a field plate electrode, wherein the field plate electrode is electrically connected with the Schottky electrode and faces the upper surface of the semiconductor substrate via the insulating film within an area extending from the outer peripheral edge of the Schottky electrode to the second region over the rising surface,
    wherein the Schottky electrode is formed also on the second region of the upper surface in the forming of the Schottky electrode, and
    a part of the Schottky electrode formed on the second region of the upper surface is also removed in the etching of the second region of the upper surface of the semiconductor substrate.

2. The method according to claim 1, wherein
    the semiconductor substrate is a substrate of oxide semiconductor, and
    with a vacuum level as a reference, a Conduction Band Minimum (CBM) of the oxide semiconductor is lower than −4.0 eV and a Valence Band Maximum (VBM) of the oxide semiconductor is lower than −6.0 eV.

3. The method according to claim 1, wherein the semiconductor substrate is a substrate of gallium oxide.

4. The method according to claim 1, wherein the forming of the insulating film is performed by a mist CVD method.

5. The method according to claim 1, wherein
the semiconductor substrate prepared in the preparing comprises an n-type drift layer and an n-type high resistivity layer that is lower in carrier density than the drift region, the high resistivity layer surrounds the drift region in the upper surface, and
a boundary of the first region and the second region is located in the high resistivity layer.

6. The method according to claim 5, wherein the preparing of the semiconductor substrate comprises:
forming the drift layer by epitaxial growth;
etching a part of the drift layer to form a groove at a position where the high resistivity layer is to be formed; and
forming the high resistivity layer within the groove by epitaxial growth.

7. The method according to claim 6, wherein the epitaxial growth of the high resistivity layer is performed by a mist CVD method.

8. The method according to claim 1, further comprising:
performing an ion-implantation of impurities to the upper surface of the semiconductor substrate, the ion-implantation being performed between the etching of the second region and the forming of the insulating film,
wherein the ion-implantation is performed with a use of the Schottky electrode as a mask,
the impurities have a property of reducing carrier density of the semiconductor substrate, and
the impurities are implanted along a direction angled from a normal direction of the first region of the semiconductor substrate so as to be implanted under the Schottky electrode.

9. A method of manufacturing a semiconductor device, the method comprising:
preparing an n-type semiconductor substrate that comprises a first region and a second region in an upper surface of the semiconductor substrate, wherein the second region surrounds the first region;
forming a Schottky electrode at least on the first region of the upper surface of the semiconductor substrate such that the Schottky electrode is in Schottky-contact with the upper surface of the semiconductor substrate;
etching the second region of the upper surface of the semiconductor substrate such that the first region becomes higher than the second region, a rising surface is formed between the first region and the second region, and an outer peripheral edge of the Schottky electrode is located on the first region;
forming an insulating film on the upper surface of the semiconductor substrate, wherein the insulating film annularly extends along the rising surface, an inner peripheral edge of the insulating film is located on the Schottky electrode and an outer peripheral edge of the insulating film is located on the second region; and
forming a field plate electrode, wherein the field plate electrode is electrically connected with the Schottky electrode and faces the upper surface of the semiconductor substrate via the insulating film within an area extending from the outer peripheral edge of the Schottky electrode to the second region over the rising surface,
performing an ion-implantation of impurities to the upper surface of the semiconductor substrate, the ion-implantation being performed between the etching of the second region and the forming of the insulating film,
wherein the ion-implantation is performed with a use of the Schottky electrode as a mask,
the impurities have a property of reducing carrier density of the semiconductor substrate, and
the impurities are implanted along a direction angled from a normal direction of the first region of the semiconductor substrate so as to be implanted under the Schottky electrode.

10. The method according to claim 9, wherein
the semiconductor substrate is a substrate of oxide semiconductor, and
with a vacuum level as a reference, a Conduction Band Minimum (CBM) of the oxide semiconductor is lower than −4.0 eV and a Valence Band Maximum (VBM) of the oxide semiconductor is lower than −6.0 eV.

11. The method according to claim 9, wherein the semiconductor substrate is a substrate of gallium oxide.

12. The method according to claim 9, wherein the forming of the insulating film is performed by a mist CVD method.

* * * * *